(12) United States Patent
Peng et al.

(10) Patent No.: US 12,414,343 B2
(45) Date of Patent: Sep. 9, 2025

(54) SEMICONDUCTOR DEVICE WITH DIFFERENT SIZED EPITAXIAL STRUCTURES

(71) Applicant: GLOBALFOUNDRIES U.S. Inc., Malta, NY (US)

(72) Inventors: Jianwei Peng, Clifton Park, NY (US); Hong Yu, Clifton Park, NY (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 391 days.

(21) Appl. No.: 18/183,468

(22) Filed: Mar. 14, 2023

(65) Prior Publication Data

US 2024/0313054 A1    Sep. 19, 2024

(51) Int. Cl.
| | |
|---|---|
| H10D 84/01 | (2025.01) |
| H10D 62/13 | (2025.01) |
| H10D 64/01 | (2025.01) |
| H10D 64/23 | (2025.01) |
| H10D 64/27 | (2025.01) |
| H10D 84/03 | (2025.01) |
| H01L 21/311 | (2006.01) |

(52) U.S. Cl.
CPC ......... *H10D 62/151* (2025.01); *H10D 64/021* (2025.01); *H10D 64/259* (2025.01); *H10D 64/514* (2025.01); *H10D 84/0167* (2025.01); *H10D 84/017* (2025.01); *H10D 84/0184* (2025.01); *H10D 84/038* (2025.01); *H01L 21/31144* (2013.01)

(58) Field of Classification Search
CPC ..................... H10D 62/151; H10D 84/0167
See application file for complete search history.

(56) References Cited

U.S. PATENT DOCUMENTS

| | | | |
|---|---|---|---|
| 9,806,170 B1 * | 10/2017 | Mulfinger | .......... H10D 30/0275 |
| 10,651,171 B2 * | 5/2020 | Ching | ................. H01L 21/0217 |
| 10,756,184 B2 | 8/2020 | Mulfinger et al. | |

* cited by examiner

*Primary Examiner* — Douglas M Menz (57) ABSTRACT

An apparatus has a first gate structure of a core device on a substrate, a first L-shaped spacer covering a sidewall of the first gate and part of the substrate adjacent to the first gate, a first raised source/drain (S/D) structure on the substrate and spaced apart from the first gate by the first L-shaped spacer, a second gate of an I/O device on the substrate, a second L-shaped spacer covering a sidewall of the second gate and part of the substrate adjacent to the second gate, and a second raised S/D structure spaced apart from the second gate by the second L-shaped spacer. The first and second L-shaped spacers have the same spacer width, and a distance between the first gate structure and a sidewall of the first S/D structure is less than a distance between the second gate structure and a sidewall of the second S/D structure.

20 Claims, 5 Drawing Sheets

SEMICONDUCTOR DEVICE WITH DIFFERENT SIZED EPITAXIAL STRUCTURES

BACKGROUND

In advanced FDX technology, multiple devices are present on the same wafer, including a core device and an I/O device. Digital circuitry comprises core devices, while analog components may include I/O devices. It is advantageous to form as many structures as possible using the same processing steps to increase processing efficiency. However, different devices have different constraints, so there can be a tradeoff between processing efficiency and device optimization. Core devices use thicker spacers to achieve standard reliability requirements, and thin spacers are desirable on I/O devices to maintain standard performance criteria.

A thicker spacer provides a higher Vmax for an I/O device, but limits the performance of a core device. Conventional approaches to increase core device performance involve using multiple spacer materials, sacrificing core performance by using thicker spacers on all devices, and performing additional processing and epitaxial growth steps to support NFET and PFET I/O devices. Each of these approaches has significant tradeoffs between performance and process complexity.

SUMMARY

Embodiments of the present application relate to structures on semiconductor device, a semiconductor device and a method of forming the semiconductor device with different sizes epitaxial structures. In particular, embodiments relate to a wafer on which one set of raised S/D structures of an I/O device have a greater gate spacing than raised S/D structures of a core device.

In an embodiment, an apparatus includes a first gate structure of a core device on a substrate, a first L-shaped spacer over a sidewall of the first gate structure and a portion of the substrate adjacent to the first gate structure, a first raised source/drain (S/D) structure on the substrate and spaced apart from the first gate structure by the first L-shaped spacer, a second gate structure of an I/O device on the substrate, a second L-shaped spacer over a sidewall of the second gate structure and a portion of the substrate adjacent to the second gate structure, and a second raised S/D structure on the substrate and spaced apart from the second gate structure by the second L-shaped spacer. A spacer width of the first L-shaped spacer is the same as a spacer width of the second L-shaped spacer, and a distance between the first gate structure and a sidewall of the first S/D structure is less than a distance between the second gate structure and a sidewall of the second S/D structure.

In an embodiment, an electronic device has a core device with a first gate structure on the substrate, a first L-shaped spacer over a sidewall of the first gate structure and a portion of the substrate adjacent to the first gate structure, and a first raised source/drain (S/D) structure on the substrate and spaced apart from the first gate structure by the first L-shaped spacer. The electronic device has an I/O device with a second gate structure on the substrate, a second L-shaped spacer over a sidewall of the second gate structure and a portion of the substrate adjacent to the second gate structure, and a second raised source/drain (S/D) structure on the substrate and spaced apart from the second gate structure by the second L-shaped spacer. The substrate is shared by the core device and the I/O device. A spacer width of the first L-shaped spacer is the same as a spacer width of the second L-shaped spacer, and a distance between the first gate structure and a sidewall of the first S/D structure is less than a distance between the second gate structure and a sidewall of the second S/D structure.

In an embodiment, a method includes forming a first gate structure of a core device and a second gate structure of an I/O device on a substrate; forming a first L-shaped spacer over a sidewall of the first gate structure and a portion of the substrate adjacent to the first gate structure; forming a second L-shaped spacer over a sidewall of the second gate structure and a portion of the substrate adjacent to the second gate structure, the second L-shaped spacer having the same spacer width as the first L-shaped spacer; forming a first raised source/drain (S/D) structure spaced apart from the first gate structure by the first L-shaped spacer; forming a second raised S/D structure spaced apart from the second gate structure by the second L-shaped spacer; and etching the second raised S/D structure, wherein the etching causes a distance between the first gate structure and a sidewall of the first S/D structure to be greater than a distance between the second gate structure and a sidewall of the second S/D structure.

DETAILED DESCRIPTION

The present disclosure relates to semiconductor structures and, more particularly, to faceted epitaxial source/drain regions and methods of manufacture. More specifically, the present disclosure relates to faceted epitaxial source/drain regions for fully depleted semiconductor on insulator (FD-SOI) technologies. Advantageously, the present disclosure provides raised source/drain regions with different gate spacing between core and I/O devices on the same substrate.

A detailed description of embodiments is provided below along with accompanying figures. The scope of this disclosure is limited by the claims and encompasses numerous alternatives, modifications and equivalents. Although steps of various processes are presented in a given order, embodiments are not necessarily limited to being performed in the listed order. In some embodiments, certain operations may be performed simultaneously, in an order other than the described order, or not performed at all.

Numerous specific details are set forth in the following description. These details are provided to promote a thorough understanding of the scope of this disclosure by way of specific examples, and embodiments may be practiced according to the claims without some of these specific details. Accordingly, the specific embodiments of this disclosure are illustrative, and are not intended to be exclusive or limiting. For the purpose of clarity, technical material that is known in the technical fields related to this disclosure has not been described in detail so that the disclosure is not unnecessarily obscured.

In some embodiments, the faceted epitaxial source/drain regions are PFET faceted epitaxial regions; although the faceted epitaxial source/drain regions can also be NFET faceted epitaxial regions. Typical dual raised source/drain (RSD) integration relies on additive NFET/PFET spacers to block unwanted epitaxial growth. Conventionally, spacer thickness is adapted to strike a balance between SG and EG device performance.

In embodiments of the present disclosure, the faceted epitaxial source/drain regions are formed using an L-shaped spacer technique. The L-shaped spacer may force a faceting of the epitaxial material adjacent to the gate structure. Advantageously, the L-shaped spacer provides a consistent facet, compared to conventionally formed epitaxial source/drain regions, e.g., facet-by-epi. The L-shaped spacer can also reduce gate-to-source/drain capacitance (Cov) and Cov variability and increase process yields.

The faceted epitaxial source/drain structures of the present disclosure can be manufactured in a number of ways using a number of different tools. In general, though, the methodologies and tools are used to form structures with dimensions in the micrometer and nanometer scale. The technologies employed to manufacture the faceted epitaxial source/drain regions of the present disclosure have been adopted from integrated circuit (IC) technology. For example, the structures are built on wafers and are realized in films of material patterned by photolithographic processes on the top of a wafer. In particular, the fabrication of the faceted epitaxial source/drain regions uses three basic building blocks: (i) deposition of thin films of material on a substrate, (ii) applying a patterned mask on top of the films by photolithographic imaging, and (iii) etching the films selectively to the mask.

Figure 1:
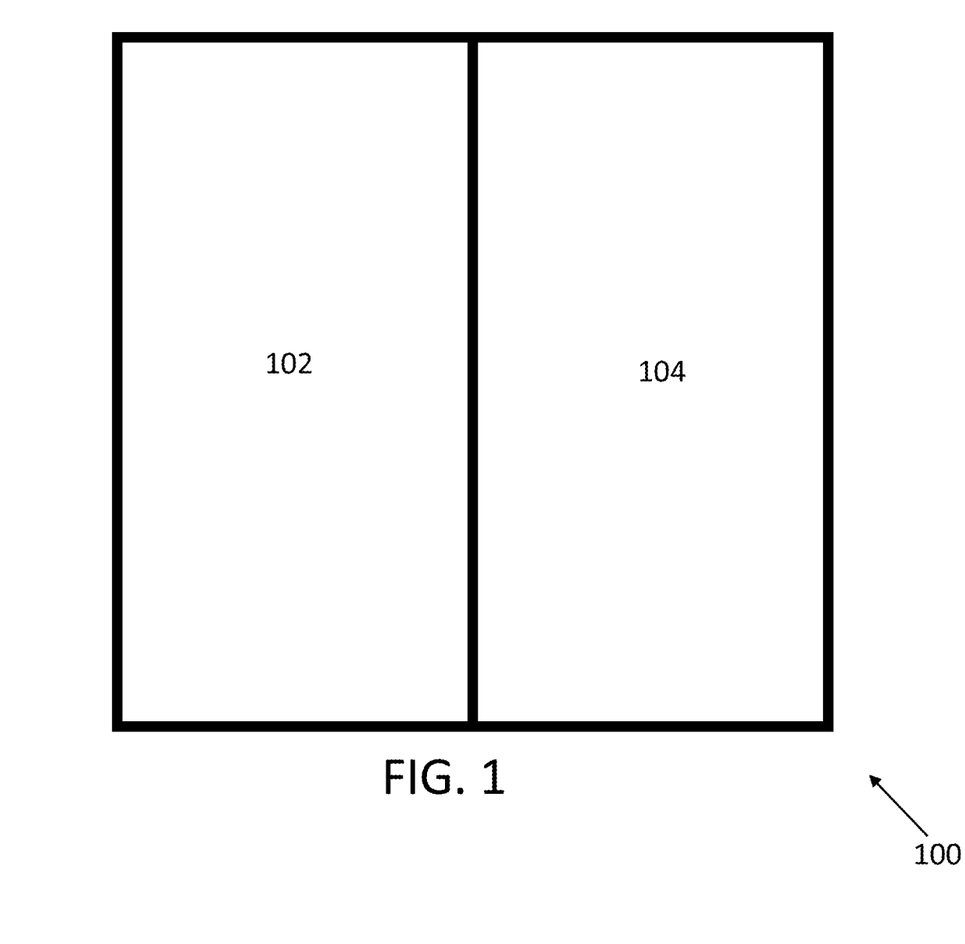
FIG. 1 illustrates an electronic device according to an embodiment.

FIG. 1 illustrates an embodiment of an electronic device 100 according to an embodiment of the present disclosure. The electronic device includes a core device 102 and an I/O device 104. The core device 102 may be a logic device with digital circuitry such as an arithmetic logic unit (ALU), a floating point unit (FPU), application specific circuitry, memory, etc. The core device 102 operates at a lower voltage (Vdd) compared to I/O device 104, and the I/O device 104 has a thicker gate dielectric film to withstand the higher gate voltage.

The I/O device 104 includes circuitry that receives and/or transmits analog signals. Examples of the analog signals include RF signals for wireless communication, optical signals, and electromagnetic signals. The core device 102 may operate at a lower voltage than the I/O device 104. For example, the core device 102 may operate at voltages (Vdd) of 0.7 to 1.0V, while the I/O device may operate at higher voltages in the range of 1.0 to 3.0V, but embodiments are not limited to these ranges.

Figure 2:
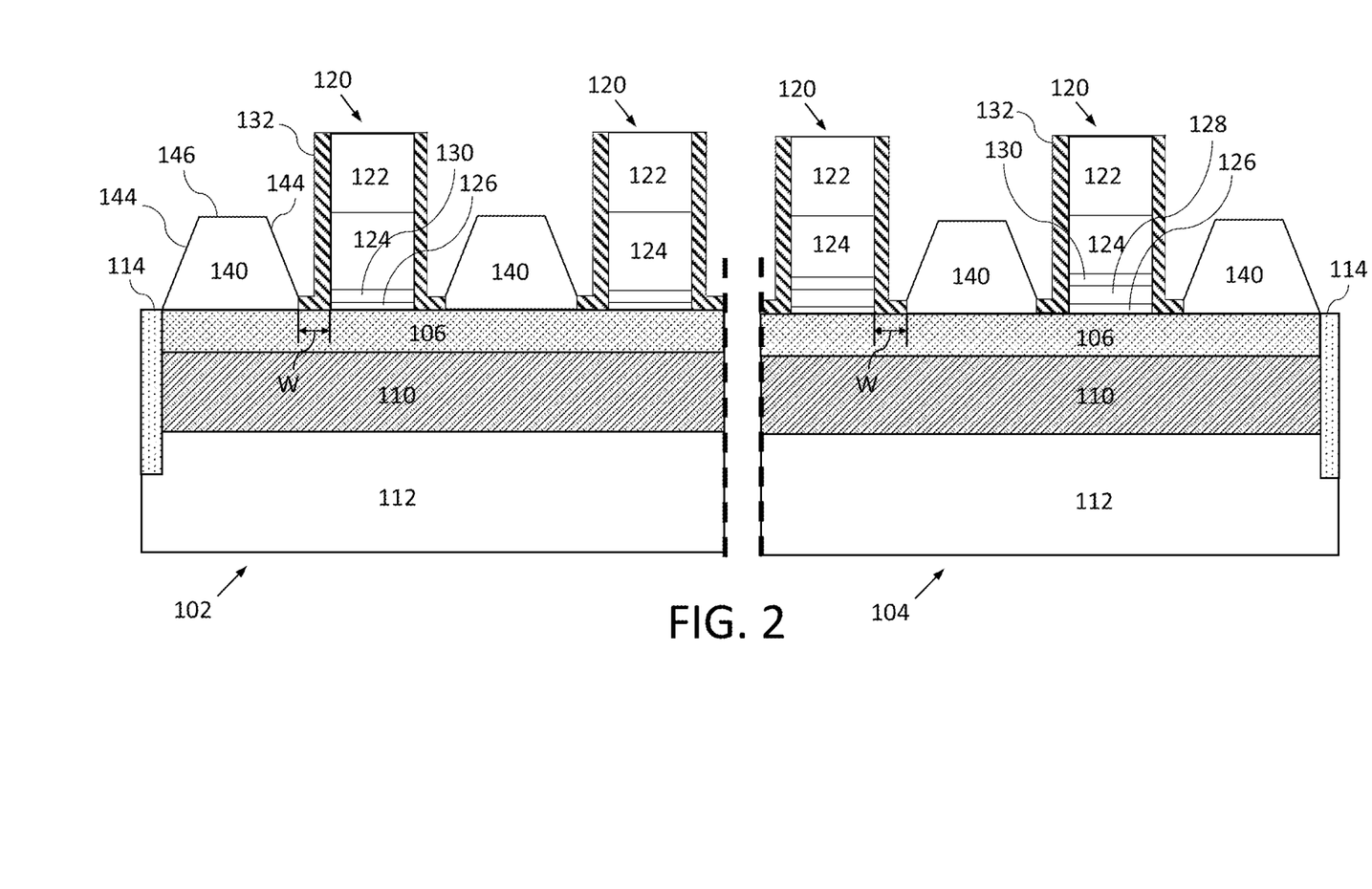
FIGS. 2-4 illustrate fabrication processes according to an embodiment.

FIG. 2 is a cross-sectional view of the electronic device 100 according to an embodiment of the present disclosure. The left side of the cross-sectional view shows structures of the core device 102, and the right side of the cross-sectional view shows structures of the I/O device 104.

The core device 102 includes a semiconductor substrate comprising a semiconductor substrate material 112, an oxide layer 110, and a semiconductor layer 106 that is also a channel region. The semiconductor substrate material 112 may be a silicon material, but other embodiments are possible. The oxide layer 110 is bonded to the substrate material 112, and can be silicon oxide, for example. The oxide layer 110 can be a buried oxide (BOX) layer.

A semiconductor layer 106 is disposed over the oxide layer 110. In an embodiment, the combination of the semiconductor layer 106, oxide layer 110 and semiconductor substrate material 112 are provided as a silicon on insulator (SOI) structure. In embodiments, the semiconductor layer 106 is a fully depleted semiconductor layer in an SOI (FD-SOI) device.

When semiconductor layer 106 is for a PFET device, the semiconductor layer 106 can be a crystalline SiGe material, and when semiconductor layer 106 is for a NFET device, the semiconductor layer 106 can be a silicon material. In both cases, semiconductor layer 106 is a channel region for the FETs. In some embodiments, FETS of core device 102 are NFETS, and FETS of I/O device 104 are PFETS, but other embodiments are possible.

Also present on the device are shallow trench isolation structures 114. The shallow trench isolation structures 114 may be formed between PFET and NFET devices, and may comprise an insulating material such as a silicon oxide material. In addition, the shallow trench isolation structures 114 may define the footprint of epitaxial raised source/drain (RSD) structures 140 in an epitaxial growth process.

In embodiments, the shallow trench isolation structures 114 are formed by conventional lithography, etching and deposition processes such that no further explanation is required for a complete understanding of the present disclosure. For example, a resist formed over the semiconductor layer 106 is exposed to energy (light) to form a pattern (opening). An etching process with a selective chemistry, e.g., reactive ion etching (RIE), is used to form an opening in the semiconductor layer 106 through the openings of the resist. The resist is then removed by a conventional oxygen ashing process or other known stripants. An oxide is deposited within the opening, followed by a planarization process, e.g., chemical mechanical planarization (CMP). The deposition of the oxide can be a conventional deposition process, e.g., chemical vapor deposition (CVD) process.

Still referring to FIG. 2, gate structures 120 are formed on the semiconductor layer 106. The gate structures 120 can be formed by a gate first process using conventional deposition, lithography and etching processes such that no further explanation is required for a complete understanding of the present disclosure. In embodiments, the gate structures 120 include a dielectric structure including high-K gate dielectric layer 126 and an oxide layer 128. The high-K dielectric layer 126 material can be, e.g., $HfO_2$ $Al_2O_3$, $Ta_2O_3$, $TiO_2$, $La_2O_3$, $SrTiO_3$, $LaALO_3$, $ZrO_2$, $Y_2O_3$, $Gd_2O_3$, and combinations including multiple layers of different high-K materials. The material of oxide layer 128 can be a silicon oxide material.

Another possible difference between the core device 102 and the I/O device 104 is the composition of the gate dielectric materials. In an embodiment, the gate dielectric of the I/O device 104 is thicker than the gate dielectric of the core device 102. For example, in FIG. 2, gate structures 120 of the I/O device 104 have both an oxide dielectric layer 128 and a high-K dielectric layer 126, while gate structures 120 of the core device 102 only have a high-K dielectric layer 126, and lack an oxide dielectric layer. In another embodiment, the core device 102 and the I/O device 104 both have a single layer of dielectric material for the gate dielectric, and the layer of dielectric material of the I/O device 104 is thicker than the dielectric material of the core device 102.

A capping layer 130 is disposed over the gate dielectric. The capping layer 130 can be TiN or TaN deposited directly over the gate dielectric layers to define the final work function of the metal gate stack. A layer 124 of poly material, e.g., polysilicon, is disposed over the gate dielectric, and a gate capping layer 122 is disposed over the gate poly layer. The gate capping layer 122 may be a nitride material such as SiN. In embodiments, the gate capping layer 122 prevents epitaxial material from growing on the gate structures 120.

L-shaped spacers 132 are disposed on both sides of the gates 120. The L-shaped spacers 132 may include a dielectric material such as a low-K dielectric material. Examples of the material of L-shaped spacers 132 are nitride materials such as SiN, SiBCN (with B reducing the permittivity of the K value) and SiOCN. Materials of the L-shaped spacers 132 can be deposited by a conventional deposition process, e.g., atomic layer deposition (ALD) process to a thickness of about 4 nm; although other dimensions are contemplated herein depending on the particular technology nodes and/or design parameters.

While the embodiment in FIG. 2 only shows a single layer of material in spacers 132, in other embodiments, the L-shaped spacers comprise two or more layers of material. Examples of L-shaped spacers 132 that may be present in embodiments of this disclosure are known in the art.

Also shown in FIG. 2 are raised diffusion regions. In the embodiment of FIG. 2, the core device 102 has first raised source/drain (S/D) structures 140, and I/O device 104 has second raised S/D structures 140. The raised S/D structures 140 are epitaxial structures which are grown on exposed portions of the substrate. In the embodiment of FIG. 2, the raised S/D structures 140 are grown on semiconductor layer 106.

The L-shaped spacers 132 force a consistent faceting of the raised S/D structures 140 adjacent to the gate structures 120. With the L-shaped spacers 132, faceting is consistent and repeatable across the wafer, wafer-to-wafer, lot-to-lot, and across epi-tools. The L-shaped spacers 132 will also reduce Cov (due to the space provided between the raised S/D structures 140 and the gate structures 120). Sidewalls of the epitaxially grown faceted raised S/D structures 140 are (111) faces, and top surfaces of the S/D structures 140 are a (100) faces.

The material of channel region 106 may be a semiconductor material such as silicon or silicon germanium, and the material of channel region 106 of core device 102 may be the same or different from the material of channel region 106 of I/O device 104. In some embodiments, the material of channel region 106 of the core device 102 is silicon germanium, while the material of channel region 106 of the I/O device 104 is silicon.

The size of the portion of the lower leg of L-shaped spacers 132 that spans the width W between gate structures 120 and raised S/D regions 140 is the same for the core device 102 and the I/O device 104. Put another way, the portion of a first L-shaped spacer 132 that extends over the portion of the substrate adjacent to a gate structure 120 of the core device 102 extends for the same distance as the portion of a second L-shaped spacer 132 that extends over the portion of the substrate adjacent to a second gate structure 120 of the I/O device 104. As a result, after performing the epitaxial growth process to form raised S/D structures 140, raised S/D structures 140 of the core device 102 have the same spacing to adjacent gate structures 120 as the I/O device 104. The width W may be referred to as the spacer width of the L-shaped spacers 132.

In some embodiments, the size of S/D structures 140 of core device 102 are different, e.g. smaller, than the size of S/D structures 140 of I/O device 104. In other embodiments, the sizes of the S/D structures 140 of core device 102 are the same as the sizes of S/D structures 140 of I/O device 104.

Figure 3:
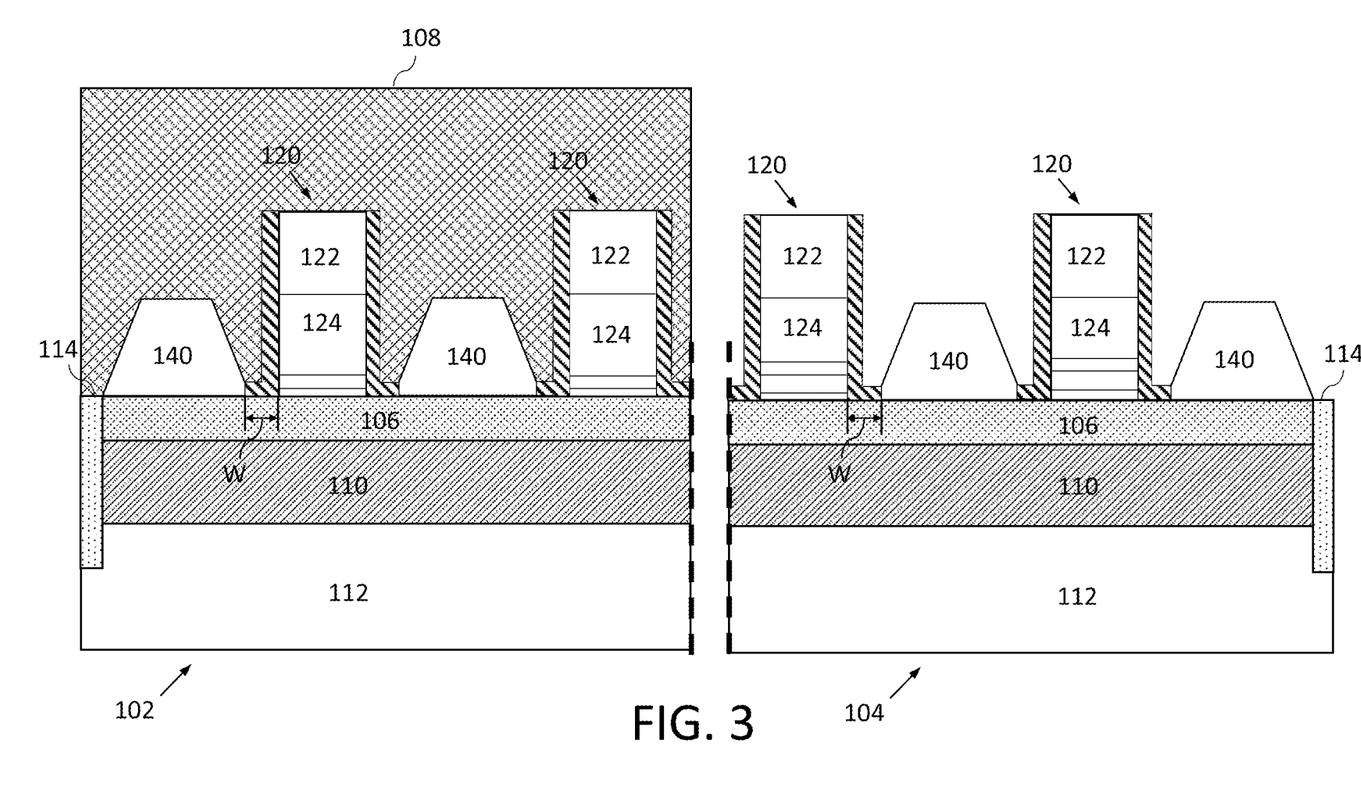

After forming raised S/D structures 140, as illustrated in FIG. 3, a mask pattern 108 is applied to cover S/D structures 140 of the core device 102 and expose the raised S/D structures 140 of the I/O device 104. The mask pattern 108 may be formed by processes as known in the art, for example, by applying a film of photoresist material over the upper surface of the substrate, applying a pattern of UV light to selective expose portions of the photoresist material, and removing unexposed portions of the photoresist material.

Figure 4:
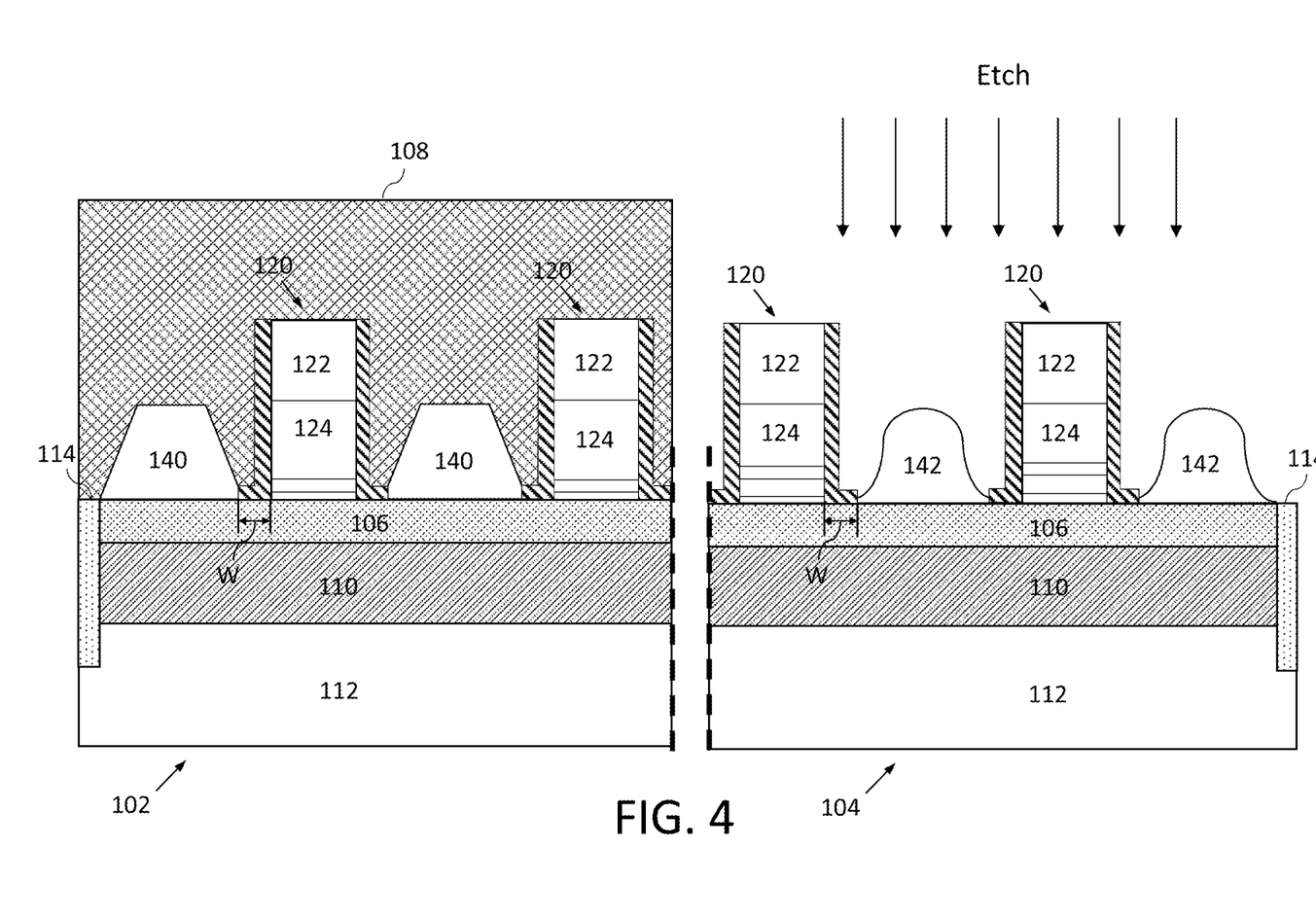

As illustrated in FIG. 4, a portion of the I/O device 104 that includes the raised S/D structures 140 is etched to remove part of the epitaxial material, thereby forming etched S/D structures 142. The etching process is not particularly limited, and may be a dry etching process. An example of a suitable dry etching process is reactive ion etching (RIE) using carbon tetrafluoride ($CF_4$). In another embodiment, the dry etch process uses a different etchant such as sulfur hexafluoride ($SF_6$). Different etchants may be used as known in the art to selectively remove the material of the raised S/D structures 140 while minimizing the impact to other exposed structures.

In another embodiment, a wet etching process is performed to form etched S/D structures 142. When the raised S/D structures 140 of the I/O device 104 are a SiGe material, the wet etching process may use a material such as a mixture of acetic acid ($CH_3COOH$), hydrogen peroxide ($H_2O_2$), and hydrofluoric acid (HF) to selectively etch the SiGe S/D structures of the I/O device 104 compared to exposed silicon, nitride and oxide materials. Different etchants may be used in a wet etching process as known in the art to remove any given material of the raised S/D structures of the I/O device 104.

A wet etching process may use a mask pattern 108 as illustrated in FIG. 4. Alternatively, when the raised S/D structures 140 of the core device 102 are a different material from the raised S/D structures 140 of the I/O device 104, a selective wet etching process can be used without a mask pattern 108, or with a mask pattern 108 that exposes raised S/D structures 140 of both devices.

Figure 5:
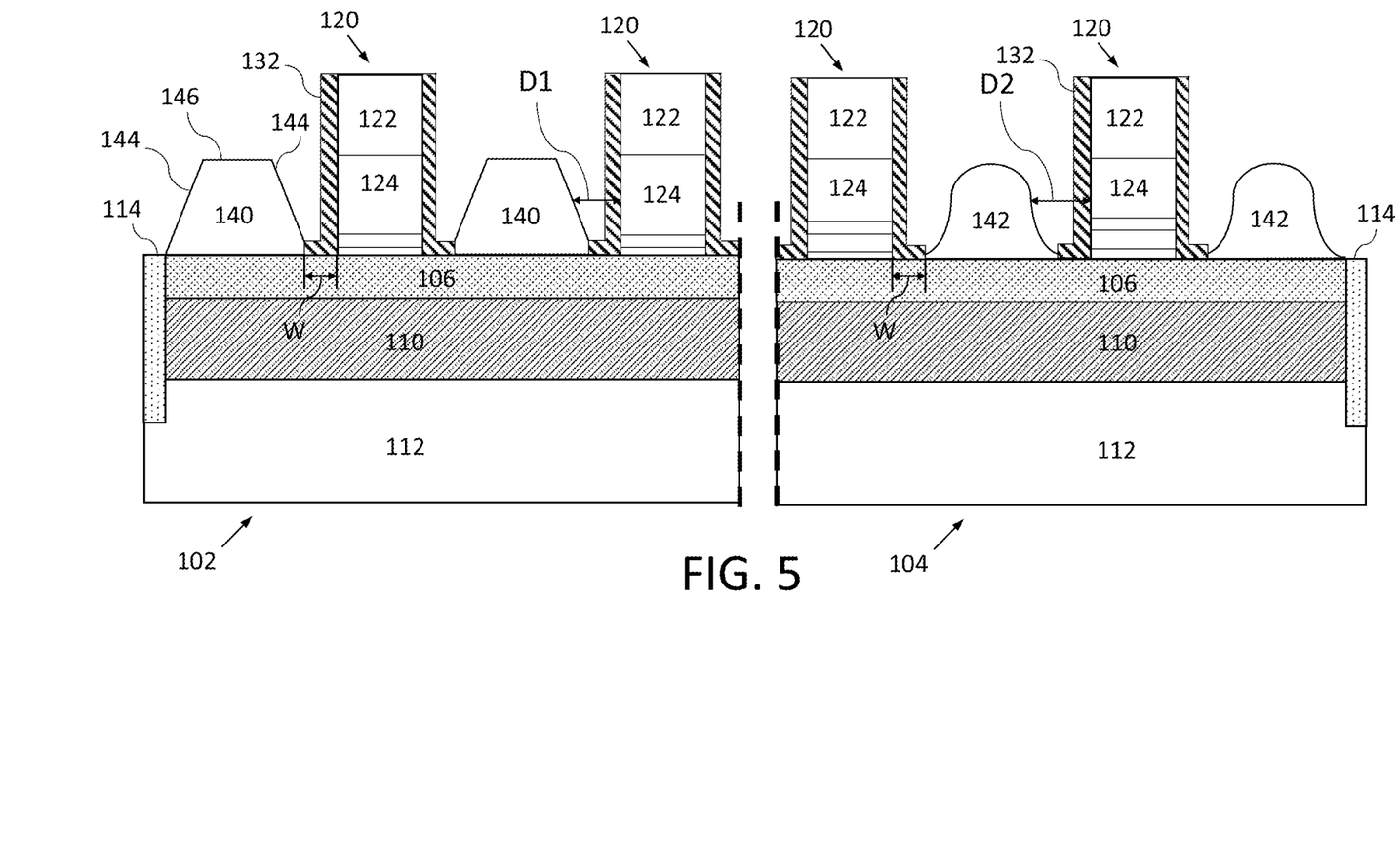
FIG. 5 illustrates a device with different sized epitaxial structures according to an embodiment.

The wet or dry etching process removes a predetermined amount of material from sidewalls, or (111) faces 144, of the raised S/D structures 140 of I/O device 104, as seen in FIG. 5. For example, the etching process may be performed to remove at least 1 nm, at least 2 nm, at least 3 nm, at least 4 nm, or at least 5 nm of material from both of the (111) faces 144 of the raised S/D structures 140. Accordingly, the etching process of FIG. 4 pushes side surfaces of the raised S/D structures away from the adjacent gate structures 120. At the same time, the etching process may remove material from the (100) faces 146, so that the etched S/D structures 142 have a reduced height.

If a mask pattern 108 is used, the mask pattern 108 is removed in a subsequent process. The resulting structure, which is a device with different sized epitaxial structures, is shown in FIG. 5.

The shape of etched S/D structures 142 is different from the shape of non-etched S/D structures 140. In an embodiment, the etched S/D structures 142 are bell-shaped as depicted in FIG. 5. While non-etched S/D structures 140 have planar faces and an angular or abrupt transition from (111) faces 144 to (100) faces 146, etched S/D structures 142 have curved sides that flare outwards on the bottom, and smooth or curved transitions between sides and the top surfaces.

The precise shape of the etched S/D structures 142 depends on the etching process used to form the structures. For example, a dry etching process may create a different shape than a wet etching process. Similarly, the etchants used by the process may affect the shape. In addition, in an embodiment in which the etched S/D structures 142 are capped with a second material (e.g. Si) that is different from the primary epitaxial material (e.g. SiGe), the capped portion of the S/D structures 142 may be etched at a different rate from the primary epitaxial material, resulting in a step between the materials in the final shape.

After etching, an average distance between sidewalls of the etched S/D structures 142 and adjacent gate structures 120 is less than an average distance between sidewalls of the non-etched S/D structures 140 and adjacent gate structures 120. In addition, a distance D2 between a sidewall of the etched S/D structures 142 and an adjacent gate structure 120 is greater than a distance D1 between a sidewall of the non-etched S/D structures 140 and adjacent gate structures 120 at the same height.

Distances D1 and D2 are measured at the same height above the substrate. The height at which D1 and D2 are measured may be the base of the highest gate poly layer 124, at a height level with the top of the portion of the L-shaped spacer 132 that extends over the substrate, or at a midpoint of a height of the non-etched S/D structures 140 and the etched S/D structures 142. The "same distance" can include minor variations as the result, for example, of engineering tolerances, e.g. plus or minus 5%, or less than 1 nm.

While the etching process of FIG. 4 removes material from the top and sides of the etched S/D structures 142, the width of the base, or the contact area between the S/D structures and the channel region 106, may be less affected than the sides or remain the same. In the embodiment of FIG. 5, a distance between the base of the non-etched S/D structures 140 and adjacent gate structures 120 is the same as a distance between the base of the etched S/D structures 142 and adjacent gate structures 120. Accordingly, while the distances D1 and D2 between the etched and non-etched S/D structures 140 and 142 and adjacent gates 120 are different, the amount of contact area between both S/D structures and channel region 106 may be the same.

The difference between distances D1 and D2 is proportional to the amount of material removed from the (111) faces 144 by the etching process. In embodiments, the distance D2 is greater than the distance D1 by at least 1 nm, at least 2 nm, at least 3 nm, at least 4 nm, or at least 5 nm. Similarly, the volume of the etched S/D structures 142 is reduced compared to their pre-etched volume.

Prior to contact formation, the raised S/D structures 140 and the gate structures 120 can undergo a silicide process as should be understood by those of skill in the art. Although not shown, an insulator material may be deposited over the raised S/D structures 140 and 142. In embodiments, the insulator material can be any interlevel dielectric materials (oxide) material deposited by conventional deposition processes, e.g., chemical vapor deposition (CVD) processes. Contacts can then be formed to the silicided regions using conventional lithography, etching and metal or metal alloy deposition processes.

Embodiments of the present disclosure have features not found in conventional structures. For example, embodiments have different spacing between sidewalls of epitaxially grown raised S/D structures (that can be formed in the same process) and adjacent gates, even though the raised S/D structures are spaced apart from the gates by L-shaped spacers having the same size. The subject matter of the present disclosure provides for forming larger raised S/D epi structures, and then reducing the size of the structures to obtain an improved device compared to forming raised S/D epi structures using two or more separate epi processes.

Accordingly, improved performance characteristics are achieved between two different devices on the same substrate with minimal process steps. The increased distance between the gate and raised S/D structure can increase the time dependent dielectric breakdown (TDDB) voltage of the I/O device 104 by 0.5 volts or more.

Many different devices can be improved by embodiments of the present disclosure. For example, core devices of an SRAM may benefit from embodiments of this disclosure due to geometrical limitations of pull-up transistors (e.g. SiGe transistors), which leads to challenges with performance and contacts.

The processes described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). The chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Aspects of the present disclosure have been described in conjunction with the specific embodiments thereof that are proposed as examples. Numerous alternatives, modifications, and variations to the embodiments as set forth herein may be made without departing from the scope of the claims set forth below. Accordingly, embodiments as set forth herein are intended to be illustrative and not limiting.

The invention claimed is:

1. An apparatus, comprising:
a first gate structure of a core device on a substrate;
a first L-shaped spacer over a sidewall of the first gate structure and a portion of the substrate adjacent to the first gate structure;
a first raised source/drain (S/D) structure on the substrate and spaced apart from the first gate structure by the first L-shaped spacer;
a second gate structure of an I/O device on the substrate;
a second L-shaped spacer over a sidewall of the second gate structure and a portion of the substrate adjacent to the second gate structure; and
a second raised S/D structure on the substrate and spaced apart from the second gate structure by the second L-shaped spacer,
wherein a spacer width of the first L-shaped spacer is the same as a spacer width of the second L-shaped spacer, and
wherein a distance between the first gate structure and a sidewall of the first S/D structure is less than a distance between the second gate structure and a sidewall of the second S/D structure.

2. The apparatus of claim 1, wherein sidewalls of the first S/D structure are (111) faces, and a top surface of the first S/D structure is a (100) face.

3. The apparatus of claim 2, wherein sidewalls and a top surface of the second S/D structure are rounded.

4. The apparatus of claim 2, wherein transitions between the sidewalls of the first S/D structure and the top surface of the first S/D structure are angled corners between the (111)

faces and the (100) face, and transitions between the sidewalls of the second S/D structure and the top surface of the second S/D structure are rounded corners.

5. The apparatus of claim 1, wherein the substrate is a fully depleted silicon-on-insulator (SOI) substrate.

6. The apparatus of claim 1, wherein a channel material of the first gate structure is silicon germanium, and a channel material of the second gate structure is silicon.

7. The apparatus of claim 1, wherein a thickness of a gate dielectric of the first gate structure is less than a thickness of a gate dielectric of the second gate structure.

8. The apparatus of claim 1, wherein the first and second raised S/D structures are epitaxial semiconductor structures.

9. The apparatus of claim 1, wherein the first and second raised S/D structures are epitaxial structures, the first raised S/D structure has faceted side and top faces, and the second raised S/D structure has an etched top and sides.

10. The apparatus of claim 1, wherein a distance between the first gate structure and a base of the first raised S/D structure is the same as a distance between the second gate structure and a base of the second gate structure.

11. A method comprising:
forming a first gate structure of a core device and a second gate structure of an I/O device on a substrate;
forming a first L-shaped spacer over a sidewall of the first gate structure and a portion of the substrate adjacent to the first gate structure;
forming a second L-shaped spacer over a sidewall of the second gate structure and a portion of the substrate adjacent to the second gate structure, the second L-shaped spacer having the same spacer width as the first L-shaped spacer;
forming a first raised source/drain (S/D) structure spaced apart from the first gate structure by the first L-shaped spacer;
forming a second raised S/D structure spaced apart from the second gate structure by the second L-shaped spacer; and
etching the second raised S/D structure,
wherein the etching causes a distance between the first gate structure and a sidewall of the first S/D structure to be greater than a distance between the second gate structure and a sidewall of the second S/D structure.

12. The method of claim 11, wherein a material of the first raised S/D structure is different from a material of the second raised S/D structure.

13. The method of claim 11, wherein sidewalls of the first S/D structure are (111) faces, and a top surface of the first S/D structure is a (100) face.

14. The method of claim 11, wherein the substrate is a fully depleted silicon-on-insulator (SOI) substrate.

15. The method of claim 11, wherein a channel material of the first gate structure is silicon germanium, and a channel material of the second gate structure is silicon.

16. The method of claim 11, wherein a thickness of a gate dielectric of the first gate structure is less than a thickness of a gate dielectric of the second gate structure.

17. The method of claim 11, wherein a distance between the first gate structure and a base of the first raised S/D structure is the same as a distance between the second gate structure and a base of the second gate structure.

18. An electronic device comprising:
a core device including:
a first gate structure on a substrate;
a first L-shaped spacer over a sidewall of the first gate structure and a portion of the substrate adjacent to the first gate structure; and
a first raised source/drain (S/D) structure on the substrate and spaced apart from the first gate structure by the first L-shaped spacer,
an I/O device including:
a second gate structure on the substrate;
a second L-shaped spacer over a sidewall of the second gate structure and a portion of the substrate adjacent to the second gate structure; and
a second raised source/drain (S/D) structure on the substrate and spaced apart from the second gate structure by the second L-shaped spacer,
wherein a spacer width of the first L-shaped spacer is the same as a spacer width of the second L-shaped spacer,
wherein a distance between the first gate structure and a sidewall of the first S/D structure is less than a distance between the second gate structure and a sidewall of the second S/D structure.

19. The electronic device of claim 18, wherein sidewalls of the first S/D structure are (111) faces, and a top surface of the first S/D structure is a (100) face.

20. The electronic device of claim 18, wherein the first and second raised S/D structures are epitaxial structures, the first raised S/D structure has faceted side and top faces, and the second raised S/D structure has etched sides.

* * * * *